(12) United States Patent
Wietzke et al.

(10) Patent No.: US 6,452,919 B1
(45) Date of Patent: Sep. 17, 2002

(54) ASSESSMENT OF DIGITAL SIGNALS, ESPECIALLY RADIO DATA SIGNALS

(75) Inventors: Joachim Wietzke; Dieter Bombka, both of Hildesheim; Klaus-Erwin Groeger, Diekholzen, all of (DE)

(73) Assignee: Robert Bosch GmbH (DE)

( * ) Notice: Subject to any disclaimer, the term of this patent is extended or adjusted under 35 U.S.C. 154(b) by 0 days.

(21) Appl. No.: 09/341,754

(22) PCT Filed: Dec. 30, 1997

(86) PCT No.: PCT/DE97/03037

§ 371 (c)(1),
(2), (4) Date: Oct. 20, 1999

(87) PCT Pub. No.: WO98/32232

PCT Pub. Date: Jul. 23, 1998

(30) Foreign Application Priority Data

Jan. 15, 1997 (DE) .......................... 197 01 042

(51) Int. Cl.[7] .................................. H04J 1/00
(52) U.S. Cl. ...................................... 370/343
(58) Field of Search .................. 455/436, 942; 370/310, 330, 331, 343

(56) References Cited

U.S. PATENT DOCUMENTS 5,349,699 A  * 9/1994 Erben et al. ............. 455/186.1
6,094,568 A  * 7/2000 Kianush et al. .......... 455/161.1

FOREIGN PATENT DOCUMENTS

DE  41 03 061   8/1992
EP  0 497 116   8/1992

OTHER PUBLICATIONS

"Specifications of the Radio Data Systems (RDS) for VHF/FM Sound Broadcasting" of the European Broadcasting Union, Mar. 1984.

* cited by examiner

Primary Examiner—Nguyen T. Vo
Assistant Examiner—Nighi H. Ly
(74) Attorney, Agent, or Firm—Kenyon & Kenyon

(57) ABSTRACT

A method is proposed for analyzing digital signals which are transmitted on a transmission frequency other than one set on a radio receiver. For this purpose, within a read cycle of thereceiver section of a radio receiver, a short-term and temporary switchover is made, during the duration of successive bits of the digital signal, from the current frequency to the other frequency, and the bits of the digital signal received during the temporary switchovers are buffered. The buffered bits of the digital signal are analyzed subsequently to the read cycle, or concurrently therewith.

6 Claims, 3 Drawing Sheets

ASSESSMENT OF DIGITAL SIGNALS, ESPECIALLY RADIO DATA SIGNALS

FIELD OF THE INVENTION

The invention is based on a method for analyzing digital signals that are transmitted on a transmission frequency other than the one set on a radio receiver.

BACKGROUND INFORMATION

From the "Specifications of the Radio Data System (RDS) for VHF/FM Sound Broadcasting" of the European Broadcasting Union, March 1984, it is known to transmit on the radio transmission frequencies not only radio programs in the context of the Radio Data System (abbreviated RDS), but also data in the form of digital signals. Some of these data are program identifiers (PI) associated with the transmission frequencies or with the programs transmitted on the transmission frequencies, which indicate which program is being transmitted on the respective transmission frequency.

German Patent No. 41 03 061 discloses radio receivers in which the program identifiers are used to locate receivable transmission frequencies which are transmitting the same program as the current transmission frequency. To check such alternative frequencies, the reception frequency of the radio receiver is switched over to the alternative transmission frequency for the duration of the check for an alternative frequency, i.e. to check its reception field strength and the program identifier PI associated with it. The resulting signal interruptions, in the range from 20 to 30 ms or 150 to 300 ms, are annoyingly evident in the form of crackling noises. It is therefore proposed to insert into the signal gaps substitute signals which are obtained, by buffering, from the audio signal segment immediately preceding the interruption, and thus to bridge the signal interruptions.

SUMMARY OF THE INVENTION

The method according to the present invention having contrast, the advantage that because of the short duration of the switchover from the current frequency to the frequency being checked, the audio signal interruption occurring during the switchover is inaudible. In addition, the outlay for recording the audio signal segment preceding the interruption is eliminated.

A development of the method ensures, by varying the time intervals and/or the durations Tu of the switchover from the current frequency to the frequency being checked, that the switchovers do not interfere with the auditory impression even in the event of possible human hearing sensitization effects.

DETAILED DESCRIPTION

The method according to the present invention is described below with reference to a radio receiver for receiving data transmitted in accordance with the Radio Data System (RDS), but is also applicable in principle to other digitally transmitted data.

Figure 1:
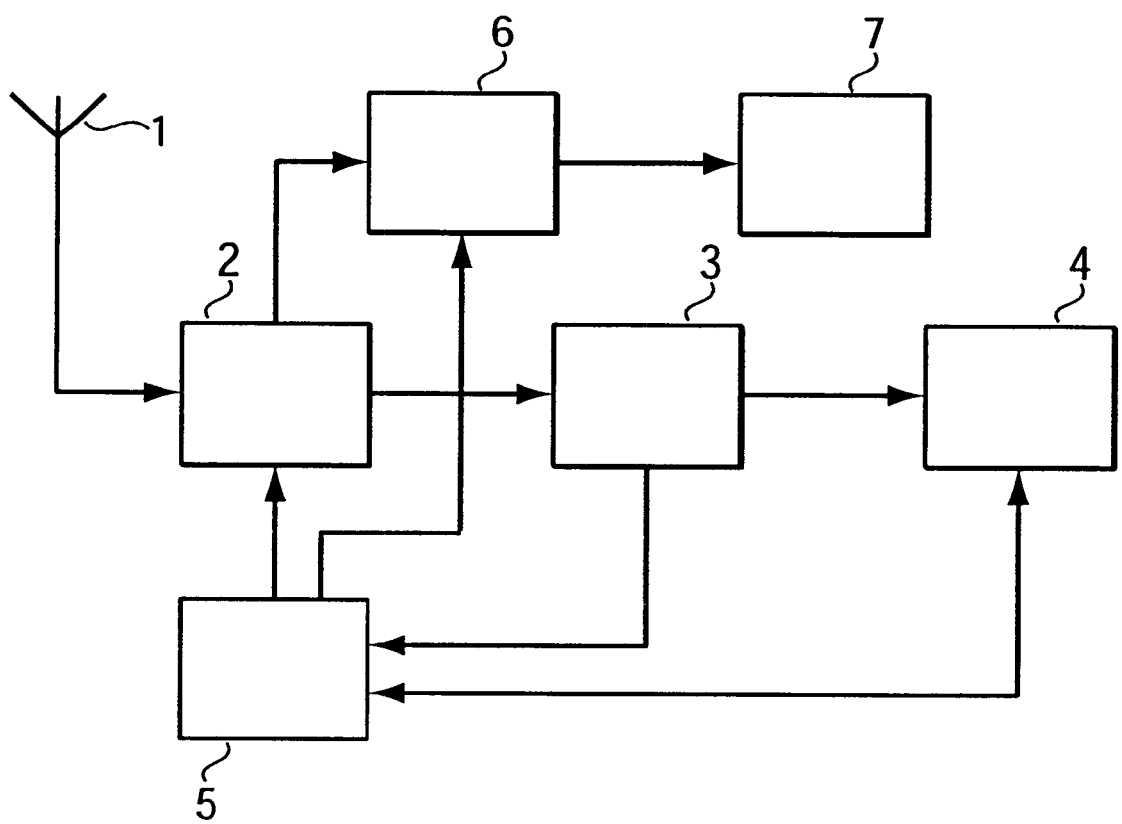
FIG. 1 shows a schematic portion of a radio receiver for carrying out the method according to the present invention.

In the radio receiver depicted in FIG. 1 for carrying out the method according to the present invention, a radio signal present at a reception antenna 1 is passed on to a receiver section 2 that has the means necessary for receiving and demodulating radio signals, such as an antenna amplifier, an adjustable phase-lock loop (PLL) for tuning receiver section 2 to a specific transmission frequency, an intermediate-frequency section, and a demodulator for demodulating the received radio signal. The phase-lock loop, activated by a controller 5, is designed as a high-speed PLL and can switch over in a few microseconds from a first to a second transmission frequency. The stereo multiplex signal present at the output of receiver section 2, with which the received transmission frequency is modulated, is on the one hand passed on via a muting circuit 6, in order to interrupt the reproduced audio signal, to a reproduction unit 7 which has in known fashion for reproduction of the audio signal contained in the stereo multiplex signal, such as stereo decoders, amplifiers, and loudspeakers. Muting circuit 6, activated by a controller 5, is designed in the present case as a controllable switch whose output is connected to a storage device, in the simplest case a capacitor. In this manner the coupling capacitors of the downstream stages are held, upon interruption of the audio signal, to the most recent value, so that crackling noises as a consequence of initial transients at the coupling capacitors upon opening and closing of the switch are effectively prevented.

The stereo multiplex signal is also conveyed to the input of an RDS demodulator 3 connected to controller 5, in order to demodulate the 57-kHz auxiliary carrier of the stereo multiplex signal modulated by the RDS signal. To store the bits of the RDS signal, the output of RDS demodulator is connected to a storage device 4, which in the present case is embodied as a toroidal storage device and in turn is also connected to controller 5.

Figure 2:
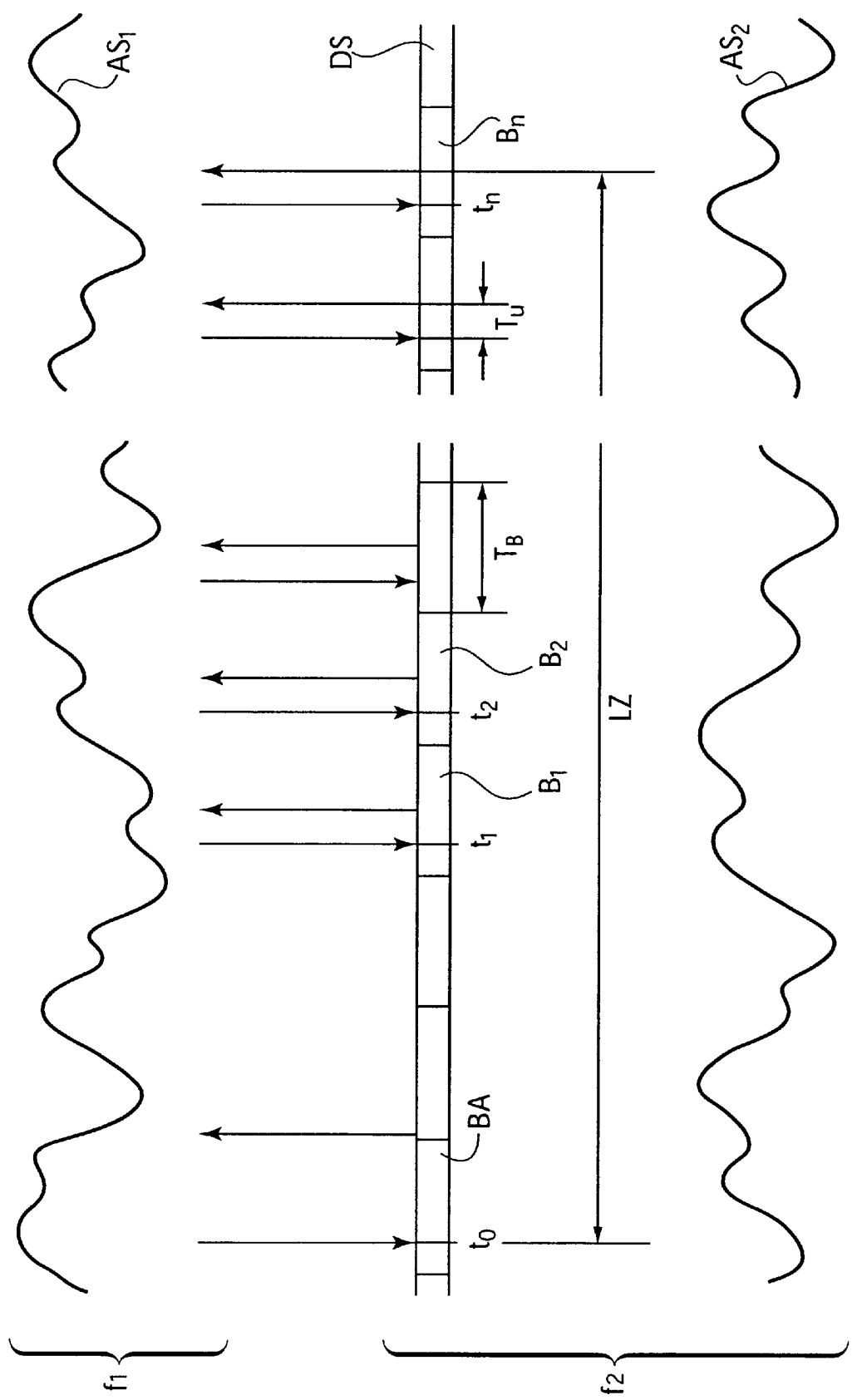
FIG. 2 shows a schematic depiction to illustrate the execution of the method according to the present invention.

The manner of operation of the method according to the present invention will be described below with the aid of an example and with reference to FIGS. 2 and 3, the initial situation being assumed to be as follows:

Receiver section 2 of the radio receiver is tuned to a first transmission frequency $f_1$ on which a first program, or in general a first analog signal $AS_1$, is being transmitted. Also known in the receiver is a second transmission frequency $f_2$, which is then to be checked to determine whether it is transmitting the same program $AS_2$ as the first transmission frequency $f_1$. The data to be analyzed are thus the program identifiers (PI) transmitted via the Radio Data System, which indicate which program is being transmitted on a specific transmission frequency. The radio data signal transmitted on the second transmission frequency $f_2$ is labeled generally in FIG. 2 as digital signal DS.

Figure 3:
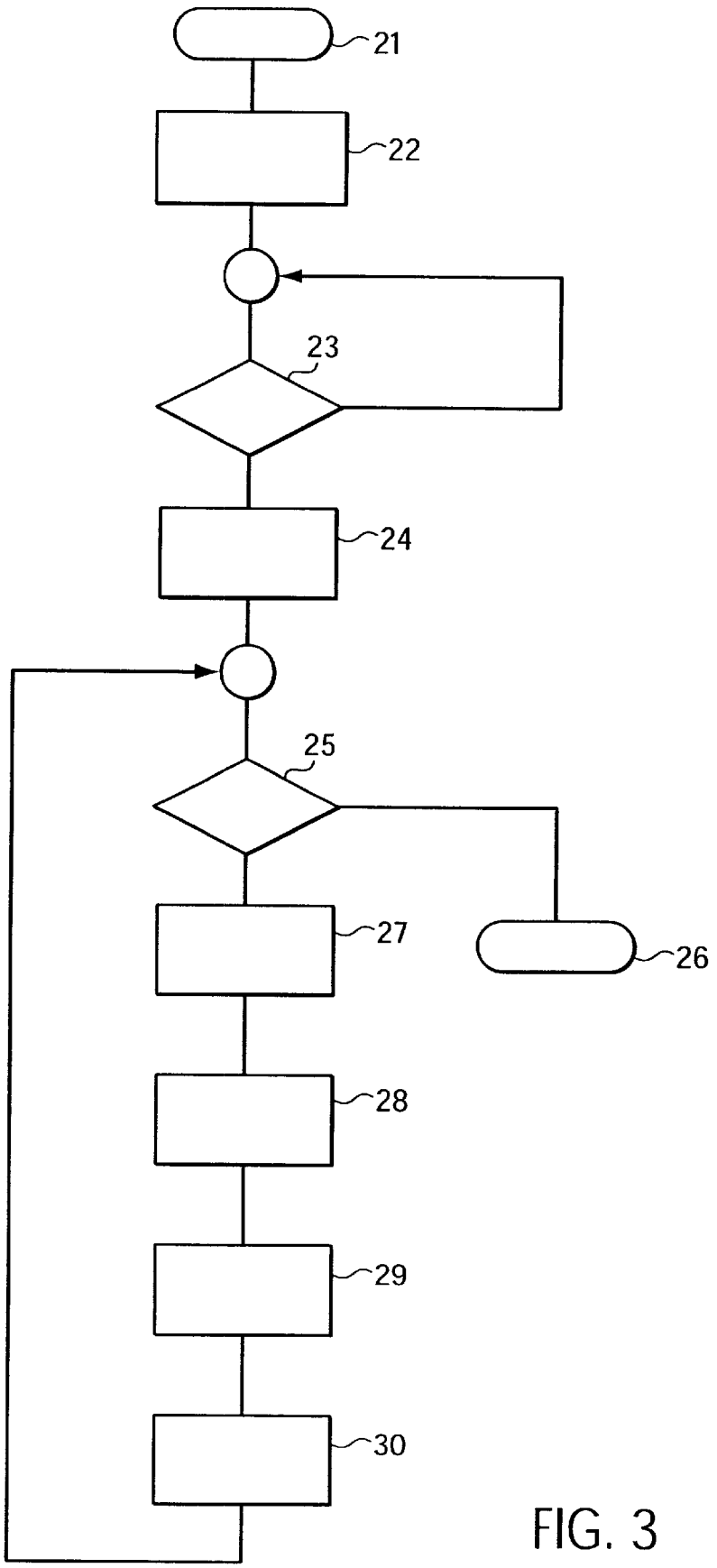
FIG. 3 shows a flow chart for the method according to the present invention.

Execution of the method according to the present invention begins with step 21 of the flow chart depicted in FIG. 3. At time $t_0$, the phase-lock loop of receiver section 2 is switched over, upon a signal of controller 5, from first transmission frequency $f_1$ to second transmission frequency $f_2$ (step 22 in FIG. 3), and reproduction of the program is interrupted by way of muting circuit 6. The phase-lock loop remains switched over to second transmission frequency $f_2$ until RDS demodulator 3 has detected starting point BA of a bit of digital signal DS, which is ascertained in step 23. Once a bit starting point BA has been detected, the phase-lock loop of receiver section 2 is switched back (at 24), upon a signal of controller 5, to first transmission frequency $f_1$, and reproduction of the received audio program is continued via muting circuit 6.

From a knowledge of the temporal position of a bit starting point BA and of duration $T_B$ of a bit or the data rate of digital signal DS, the temporal position of the further bits of the digital signal is determined. At 27, a further switchover time $t_1$ is determined in such a way that switchover duration $T_u$, during which the phase-lock loop of receiver section 2 remains switched over to second transmission frequency $f_2$, lies within duration $T_B$ of a subsequent bit of the digital signal. The length of switchover duration $T_u$ is dimensioned so as to ensure that the PLL locks securely onto second transmission frequency $f_2$, and so that the bit of digital signal DS present at the output of demodulator 3 is reliably determined. On the other hand, switchover duration $T_u$ is designed to be sufficiently short that the switchover operation is not audible even with rapidly recurring switchover operations. Switchover duration $T_u$ is on the order of approximately 80 $\mu$s.

At 28, the phase-lock loop of receiver section 2 is switched over, at the calculated time $t_1$, to second transmission frequency $f_2$, and audio signal reproduction is simultaneously interrupted via muting circuit 6. The bit of digital signal DS present at the output of demodulator 3 is read into storage device 4 (step 29), whereupon, after switchover period $T_u$ has elapsed, the phase-lock loop is switched back (at 30) to first transmission frequency $f_1$ and audio signal reproduction via muting circuit 6 is continued.

The method is continued at 27 with the determination of a further switchover time $t_i$ (i=2, ..., n), further switchover time $t_i$ being selected so that switchover duration $T_u$ of the further switchover lies within the duration $T_B$ of that bit $B_i$ (i=2, ..., n) of the digital signal which immediately follows the most recently read bit $B_{i-1}$.

The method is continued until a number n of switchovers has occurred, and thus n successive bits of digital signal DS have been stored in storage device 4. Attainment of the predefined number n, which corresponds to the number of bits contained in one block of the digital signal (i.e. 26 bits in the case of RDS), is checked at 25 as an abort condition, whereupon read cycle LZ is terminated at 26.

In a variant of the method according to the present invention, provision is made that after detection of a bit starting point BA of digital signal DS at 24, the phase-lock loop of receiver section 2 is not switched directly to first transmission frequency $f_1$, but rather the bit of digital signal DS whose starting point BA was detected is read into storage device 4 as bit $B_1$. The method is then continued at step 27 with the calculation of a further switchover time $t_i$ (i=2, ..., n), so that by omission of the switchover back from second transmission frequency $f_2$ to first transmission frequency $f_1$ once bit starting point BA has been detected, the switchover at time $t_i$, and thus two frequency changes per read cycle LZ, are eliminated.

In a further variant of the method according to the present invention, provision is made for the temporary switchovers from first transmission frequency $f_1$ to second transmission frequency $f_2$ to be accomplished not at constant but at varying time intervals, which means simply that the switchovers are accomplished at varying times within the duration $T_B$ of the respective bit $B_i$ (i=1, ..., n). Alternatively or in addition thereto, provision can also be made for the switchover durations $T_u$ to be modified within the limits defined by a minimum duration which allows reliable analysis of the respective bit, and a maximum duration within which the interruption is not audible. The underlying consideration here is that the periodic temporary frequency switchovers, although not consciously acoustically perceptible, might still interfere with the listener's auditory impression, for example as a result of human hearing sensitization effects. Such potential effects are prevented by way of the, for example, random variation in the time intervals at which the frequency switchovers occur and/or in the switchover durations $T_u$.

Read cycle LZ is followed by analysis of the data stored in storage device 4; in known fashion, the beginning of the block within the stored signal segment is determined first. Once the beginning of the block is known, the position of the datum to be analyzed (the PI, in the present case) is determined, and the datum is analyzed.

Alternatively, provision can also be made for performing the analysis of the digital information stored in storage device 4 concurrently with reading-in of the information.

What is claimed is:

1. A method for receiving a digital signal, comprising the steps of:

transmitting the digital signal with a radio program on a transmitting frequency, the transmitting frequency being different than a receiving frequency of a receiver;

within a read cycle of the receiver, temporarily switching the receiver, at predefined times from the receiving frequency to a further frequency;

at a first temporary switchover of the receiver from the receiving frequency to the further frequency, maintaining the further frequency until a bit starting point of a bit of the digital signal detected;

performing, for a second duration, each of further temporary switchovers from the receiving frequency to the further frequency during a first duration of each of successive bits of the digital signal, the second duration being shorter than the first duration;

determining the predefined times for the further temporary switchovers from the bit starting point and the first duration of the successive bits of the digital signal;

receiving the successive bits of the digital signal during the further temporary switchovers using the receiver;

buffering the successive bits of the digital signal; and analyzing the successive bits of the digital signal in an analysis cycle.

2. The method according to claim 1, wherein the digital signal includes a radio data signal.

3. The method according to claim 1, further comprising the step of:

performing the further temporary switchovers from the receiving frequency to the further frequency at varying times during the first duration.

4. The method according to claim 1, further comprising the step of:

performing the further temporary switchovers from the receiving frequency to the further frequency for varying durations during the first duration.

5. The method according to claim 1, wherein the digital signal includes a program identifier which is transmitted via a Radio Data System.

6. The method according to claim 1, further comprising the step of:

interrupting a reproduction of the radio program during the further temporary switchovers to the further frequency.

* * * * *